United States Patent
Perre et al.

(10) Patent No.: US 9,209,892 B2
(45) Date of Patent: Dec. 8, 2015

(54) AUTOMATIC GAIN CORRECTION CIRCUIT WITH VARIABLE SETPOINT

(75) Inventors: Jean-Michel Perre, Saint Peray (FR); David Depraz, Valence (FR); Frédéric Berthoz, Valence (FR)

(73) Assignee: Thales, Courbevoie (FR)

( * ) Notice: Subject to any disclaimer, the term of this patent is extended or adjusted under 35 U.S.C. 154(b) by 120 days.

(21) Appl. No.: 14/117,358

(22) PCT Filed: Apr. 17, 2012

(86) PCT No.: PCT/EP2012/056999
§ 371 (c)(1),
(2), (4) Date: Mar. 13, 2014

(87) PCT Pub. No.: WO2012/152549
PCT Pub. Date: Nov. 15, 2012

(65) Prior Publication Data
US 2014/0302776 A1    Oct. 9, 2014

(30) Foreign Application Priority Data

May 12, 2011    (FR) ..................................... 11 01442

(51) Int. Cl.
| | |
|---|---|
| *H04B 7/00* | (2006.01) |
| *H04B 7/185* | (2006.01) |
| *H03G 3/30* | (2006.01) |
| *H04B 15/00* | (2006.01) |

(52) U.S. Cl.
CPC ......... *H04B 7/18513* (2013.01); *H03G 3/3078* (2013.01); *H04B 15/00* (2013.01)

(58) Field of Classification Search
CPC .................................... H03G 3/20; H04B 7/00
USPC ............ 455/13.4, 127.2, 127.1, 126, 522, 69, 455/138, 136, 24
See application file for complete search history.

(56) References Cited

U.S. PATENT DOCUMENTS

| | | | |
|---|---|---|---|
| 4,191,995 A | 3/1980 | Farrow | |
| 4,910,797 A | 3/1990 | Min et al. | |
| 4,963,969 A * | 10/1990 | Kitaura et al. | ................. 348/572 |
| 5,666,384 A * | 9/1997 | Kuban et al. | .................. 375/285 |
| 2004/0092238 A1 | 5/2004 | Filipovic | |
| 2010/0226510 A1 * | 9/2010 | Kikugawa | ..................... 381/107 |

* cited by examiner

*Primary Examiner* — John J Lee
(74) *Attorney, Agent, or Firm* — Baker & Hostetler LLP

(57) ABSTRACT

An automatic gain correction circuit for radiofrequency signals applies notably to the regulation of the amplification of signals for satellite radionavigation. The automatic gain correction circuit is able to receive an input radiofrequency signal and to deliver an output radiofrequency signal of which a mean amplitude is slaved to a setpoint. It comprises means for modifying the setpoint as a function of the mean amplitude of the input signal between a minimum setpoint value and a maximum setpoint value, the minimum setpoint value corresponding to a first mean amplitude of the input signal and the maximum setpoint value corresponding to a second mean amplitude of the input signal, the first mean amplitude being lower than the second mean amplitude.

6 Claims, 6 Drawing Sheets

AUTOMATIC GAIN CORRECTION CIRCUIT WITH VARIABLE SETPOINT

CROSS-REFERENCE TO RELATED APPLICATIONS

This application is a National Stage of International patent application PCT/EP2012/056999, filed on Apr. 17, 2012, which claims priority to foreign French patent application No. FR 1101442, filed on May 12, 2011, the disclosures of which are incorporated by reference in their entirety.

FIELD OF THE INVENTION

The invention relates to an automatic gain correction circuit for radiofrequency signals. It applies notably to the regulation of the amplification of signals for satellite radionavigation.

BACKGROUND

Satellite radionavigation uses certain propagation properties of radioelectric waves to determine a position and a speed of a moving object on the basis of signals emitted from satellites. The durations of propagation of the radioelectric waves emitted by the satellites make it possible to determine pseudo-distances between the moving object and the satellites. Through resolution akin to triangulation, it is possible to deduce the position of the moving object. The signals emitted by satellites not being very powerful, they are easily jammed. Jamming constitutes one of the main threats in regard to the availability and continuity of satellite radionavigation service. Numerous antijamming solutions exist or are under development. In the majority of these solutions, the antijamming system implemented comprises a radiofrequency chain for selection, amplification and digitization of the signal over a band of frequencies. The signal is notably quantized in amplitude on a given scale and with a given precision. The optimal use of the quantization scale naturally depends on the power of the received signal and the signal amplification gain. Consequently, the amplification gain is generally regulated as a function of the power of the signal received by a so-called automatic gain correction circuit.

The power of the useful signal, that is to say of the signal originating from a satellite, is situated about 30 dB below the thermal noise, whereas the power of the jamming or interference signals is in general considerably greater than the power of the thermal noise. In the absence of jamming signals, the amplification of the signals is tailored for optimal quantization of the thermal noise. Quantization on a low number of bits, for example between one and three, can suffice to demodulate the signal and exploit it. On the other hand, in the presence of jamming signals, the amplification of the signals is tailored for optimal quantization of the jamming signals, thus leading to the loss of the useful signal information and thermal noise information if the quantization is carried out on a low number of bits. In order to be able to quantize the useful signal and the thermal noise, the quantization must therefore be carried out on a sufficient number of bits, of the order of 6 or 7 bits minimum. A problem nonetheless arises as regards the level of the regulating setpoint to be applied. If the setpoint level is close to the bottom of the scale of the quantizer, the jamming signals of short duration (not affecting regulation) are quantized over the whole of the scale and can therefore be suppressed by linear mathematical processing. On the other hand, the continuous jamming signals (taken into account in regulation) are quantized solely around the low values of the scale. It is then difficult to characterize them and to filter them. Furthermore, the useful signal risks being lost. Conversely, if the setpoint level is close to the top of the scale, the useful signal and the continuous jamming signals are correctly quantized. However, the jamming signals of short duration are saturated and therefore poorly processed. Moreover, in the absence of jamming, the gain in amplification is continually very high since it must raise the thermal noise level, which is of the order of −100 dBm at the input of the antenna of the radionavigation system, to the top of the quantization scale. The gain in amplification can thus attain 100 dB. Such an amplification is all the more difficult to carry out as the radiofrequency chain generally has a small shape factor and uses a unique frequency transposition. A compromise is to apply a setpoint level in the middle of the scale. However, such a setpoint level does not allow optimal quantization of the useful signal, the jamming signals of short duration, and the continuous jamming signals.

SUMMARY OF THE INVENTION

An aim of the invention is notably to remedy all or some of the aforementioned drawbacks by allowing adaptation of the amplification gain as a function of the power of the signal received. For this purpose, the subject of the invention is an automatic gain correction circuit able to receive an input radiofrequency signal and to deliver an output radiofrequency signal equal to the input signal multiplied by a gain factor so as to slave a mean amplitude of the output signal to a setpoint. The automatic gain correction circuit comprises means for modifying the setpoint as a function of the mean amplitude of the input signal between a minimum setpoint value and a maximum setpoint value, the minimum setpoint value corresponding to a first mean amplitude of the input signal and the maximum setpoint value corresponding to a second mean amplitude of the input signal, the first mean amplitude being lower than the second mean amplitude.

Advantageously, the setpoint varies linearly as a function of the mean amplitude of the input signal between the first and the second mean amplitude of the input signal.

In a particular embodiment, the automatic gain correction circuit comprises an open loop, a return loop, an adder, a subtracter, and a regulating loop. The adder receives on a first input the input signal and on a second input a signal as output from the open loop; the adder delivers on an output the output signal; the return loop receives said output signal; the regulating loop receives a signal of the open loop and delivers the setpoint; and the subtracter receives on a first input a signal as output from the return loop and on a second input the setpoint.

The open loop comprises for example an amplifier of gain G1 and an integrator mounted in series. The regulating loop can then receive the signal as output from the integrator.

The open loop can comprise, furthermore, a second amplifier of gain G2 mounted at the output of the integrator.

The return loop can comprise an amplifier of gain G3 and a rectifier which is able to extract the absolute value of the signal circulating in the return loop.

Still in a particular embodiment, the regulating loop comprises an amplifier of gain A, an adder and a functional circuit mounted in series. The adder receives on a first input the signal as output from the amplifier of gain A and on a second input a constant B. The functional circuit delivers:

a setpoint equal to the signal at the output of the adder when the value of said signal lies between the minimum setpoint value and the maximum setpoint value,
a setpoint equal to the minimum setpoint value when the value of said signal is lower than said setpoint value, and a setpoint equal to the maximum setpoint value when the value of said signal is greater than said setpoint value.

The subject of the invention is also a method for parametrizing the automatic gain correction circuit described hereinabove. More precisely, the subject of the invention is a method for determining the values of the gain A and of the constant B of the automatic gain correction circuit. The method comprises the following steps:

determining the minimum setpoint and the maximum setpoint between which the amplitude of the output signal must be slaved, determining a variation of the gain factor as a function of a power of the input signal for a predetermined setpoint, lying between the minimum setpoint and the maximum setpoint, determining a minimum amplitude value of the signal received by the regulating loop below which the output signal must be regulated to the minimum setpoint and a maximum amplitude value of the signal received by the regulating loop above which the output signal must be regulated to the maximum setpoint, determining the values of the gain A and of the constant B knowing the minimum and maximum amplitude values of the signal received by the regulating loop, the minimum and maximum setpoints, and the relation between the setpoint and the signal received by the regulating loop.

The advantage of the invention is notably to amplify the input signal as a function of the presence of jamming signals and of their type, and therefore to allow suitable quantization of the useful signal and, if appropriate, of the jamming signals.

BRIEF DESCRIPTION OF THE DRAWINGS

The invention will be better understood and other advantages will become apparent on reading the description which follows, given in relation to appended drawings in which.

DETAILED DESCRIPTION

Figure 1:
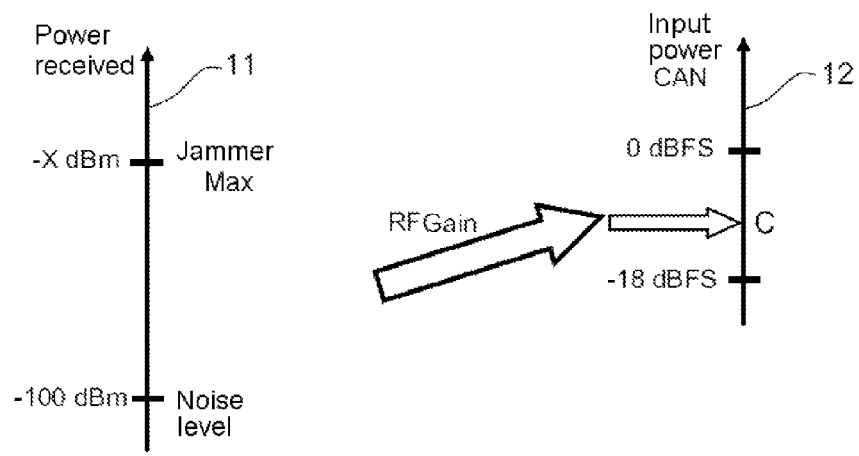
FIG. 1 illustrates an example of amplification of a signal received by a radiofrequency chain of the prior art.

FIG. 1 illustrates an example of amplification of a signal received by a radiofrequency chain (RF) with a view to digitization. By way of example, the case is considered of an RF signal used for satellite radionavigation. The amplification of the received signal is slaved in power by a so-called automatic gain correction circuit, incorporated into the RF chain. The powers considered are therefore mean powers over a duration of a few thousandths to a few tenths of a second, as a function of the response time of the automatic gain correction circuit slaving loop. A first vertical axis 11 represents a power span of the signal received by the RF chain, in dBm. The signal received by the RF chain has a power that may vary between a minimum power and a maximum power. A signal emitted by a satellite has a relatively low power, generally smaller than the power of the thermal noise of the RF chain. Moreover, the RF chain can receive signals of high power originating from other sources, which jam the signal of the satellite. Thus, the power of the signal received by the RF chain can vary between a minimum value, for example −100 dBm, corresponding to the power of the thermal noise, and a maximum value, denoted −X dBm, corresponding to the power of a jamming signal. The amplified signal is injected as input to an analog-digital converter (CAN). Such a converter operates in a linear manner over a limited operating span, called the quantization scale. Stated otherwise, the numerical value of the signal at output of the converter is proportional to the amplitude of the signal at input only for an input signal whose amplitude is situated in the quantization scale. This quantization scale is represented in FIG. 1 by a second vertical axis 12. It lies between a minimum value (−18 dBFS), and a maximum value (0 dBFS), where dBFS stands for "decibels relative to Full Scale", that is to say an amplitude relative to the quantization scale. The automatic gain correction circuit makes it possible to amplify the signal received by the RF chain so as to use the quantization scale of the CAN to the maximum. In this instance, the setpoint of the automatic gain correction circuit is generally fixed at a mean value of the quantization scale of the CAN. However, a mean setpoint is unsuitable in the presence of jamming signals.

Figure 2:
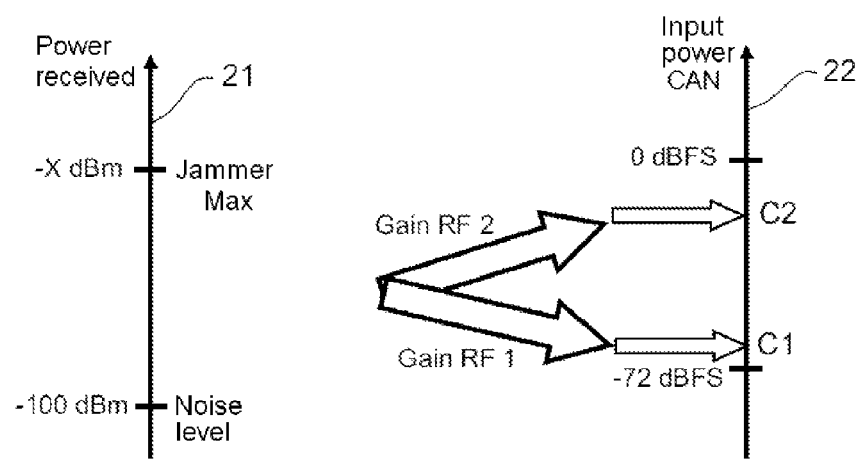
FIG. 2 illustrates the principle underpinning an automatic gain correction circuit according to the invention.

FIG. 2 illustrates the principle underpinning the automatic gain correction circuit according to the invention. In a manner analogous to FIG. 1, FIG. 2 represents, by two axes, an example of amplification of the signal received by an RF chain. The first axis 21 is identical to the first axis 11 of FIG. 1. It represents the power span of the signal received by the RF chain, in dBm. The second axis 22 represents the quantization scale of the CAN, in dBFS. In contradistinction to a conventional automatic gain correction circuit, the circuit according to the invention fixes the setpoint value as a function of the correction gain calculated. Indirectly, the setpoint value is fixed as a function of the mean amplitude of the signal received by the RF chain. The setpoint is fixed between a first value, called the low setpoint C1, and a second value, called the high setpoint C2. The low setpoint C1 is the setpoint to be applied for a mean power of the signal received that is lower than or equal to a first power. It entails a gain RF1 dependent on the power of the signal received. The high setpoint C2 is the setpoint to be applied for a mean power of the signal received that is greater than or equal to a second power. It entails a gain RF2 dependent on the power of the signal received. Between the first and the second power, the setpoint varies substantially linearly. The variation of the setpoint makes it possible to regulate the signal at the bottom of the quantization scale when it corresponds to thermal noise or to the signal of a short pulsed jammer, and to transit continuously toward regulation close to the top of the quantization scale when the signal originates from a continuous jammer.

Figure 3:
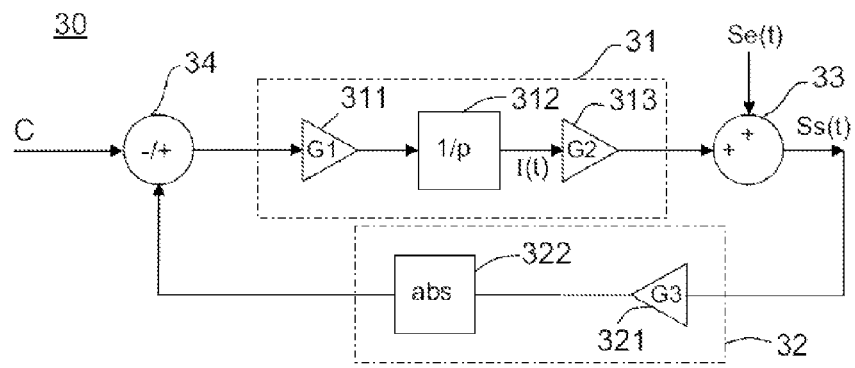
FIG. 3 represents an automatic gain correction circuit according to the prior art.

FIG. 3 represents an exemplary automatic gain correction circuit (CAG) according to the prior art. The CAG circuit 30 forms a looped system. It comprises an open loop 31, a return loop 32, an adder 33 and a subtracter 34. The adder 33 receives on a first input the signal to be amplified Se(t), and on a second input the signal as output from the open loop 31. An output of the adder 33 delivers a signal Ss(t) equal to the sum of the signal Se(t) and of the signal at the output of the open loop 31. The signal Ss(t) is injected as input to the return loop 32. It is also intended to be injected as input to the CAN. The subtracter 34 receives on a first input the signal as output from the return loop 32, and on a second input a setpoint C. An output of the subtracter 34 delivers a signal equal to the difference between the two signals received as input. This signal is injected as input to the open loop 31. The open loop 31 comprises, mounted in series, a first amplifier 311 of gain G1, an integrator 312 and a second amplifier 313 of gain G2. The return loop 32 comprises, mounted in series, a third amplifier 321 of gain G3 and a rectifier 322. The relative arrangement of the amplifier 321 and of the rectifier 322 does not have any importance within the framework of the invention. The amplifier 311 makes it possible to adjust the speed of response of the slaving. The amplifier 313 is not indispensable to the realization of the invention. It makes it possible, with the amplifier 311 and the amplifier 321, to obtain an overall gain G equal to the product of the gains G1 and G2, divided by the gain G3. The amplifier 321 represents a scale factor making it possible to pass from one physical unit to another. By way of example, the signals Se(t) and Ss(t) can be analog signals, and the slaving can be carried out digitally. The amplifier 313 can then be a digital-analog converter and the amplifier 321 an analog-digital converter. The rectifier 322 makes it possible to extract the absolute value of the signal circulating in the return loop 32 and to compare same with the setpoint C. Overall, the CAG circuit 30 makes it possible to regulate the amplitude of the signal Ss(t) as a function of the setpoint C.

Figure 4:
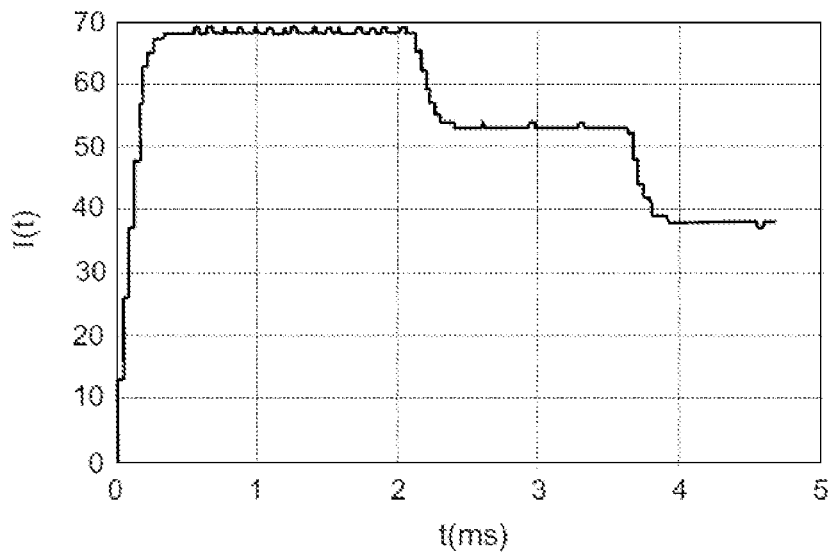
FIGS. 4 and 5 illustrate the operation of the automatic gain correction circuit of FIG. 3 by amplitudes of an internal signal and of a signal at the output of this circuit.
Figure 5:
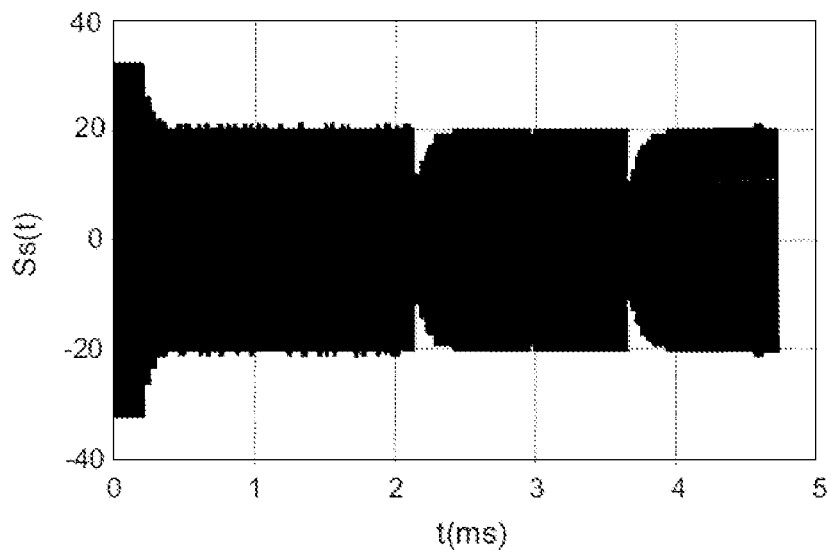

FIGS. 4 and 5 illustrate the operation of the CAG circuit 30 of FIG. 3. FIG. 4 represents, by a graph, the amplitude of the signal I(t) at the output of the integrator 312. The abscissa axis of the graph represents the time, in milliseconds. The ordinate axis represents the amplitude of the signal I(t) in numerical amplitude, in this example on 6 bits. The amplitude of the signal I(t) is represented for a signal Se(t) whose power is tier-wise constant. FIG. 5 represents, by a graph, the amplitude of the corresponding signal Ss(t) in numerical amplitude on 6 bits. The CAG circuit makes it possible, as expected, to regulate the amplitude of the signal Sst(t) around a setpoint, here equal to 20, independently of the power of the signal Se(t).

Figure 6:
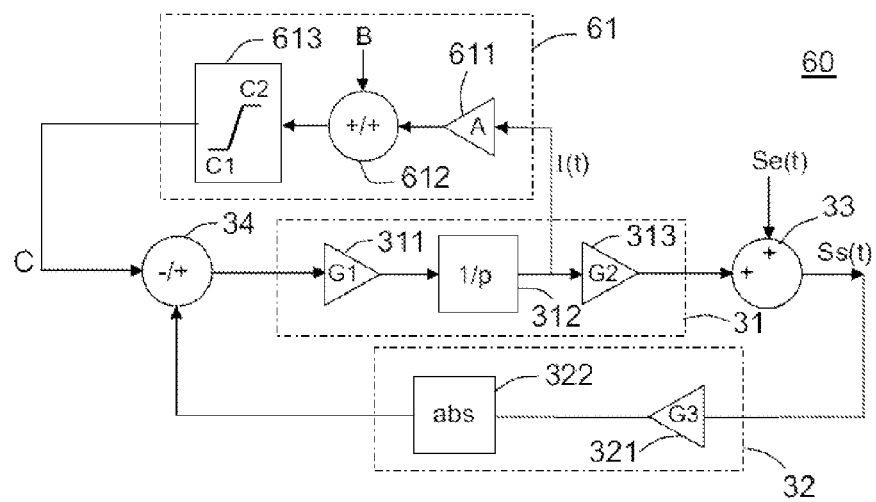
FIG. 6 represents an exemplary automatic gain correction circuit according to the invention.

FIG. 6 represents an exemplary CAG circuit according to the invention. The CAG circuit 60 according to the invention is distinguished from the CAG circuit 30 according to the prior art in that it comprises a regulating loop 61 for the setpoint C. The regulating loop 61 receives as input the signal I(t) arising from the integrator 312. It could nonetheless receive the signal of any point of the open loop 31. The signal at the output of the regulating loop 61 forms the setpoint C. The regulating loop 61 comprises for example, mounted in series, an amplifier 611 of gain A, an adder 612 and a functional circuit 613. The signal I(t) is amplified by the amplifier 611 and added to a constant B. The functional circuit 613 compares the value of the signal at the output of the adder 612 with two values, namely the low setpoint value C1 and the high setpoint value C2. When the value of the signal at the output of the adder 612 is below the low setpoint C1, the functional circuit 613 fixes the setpoint C at the low setpoint C1. When the value of the signal is above the high setpoint C2, the functional circuit 613 fixes the setpoint C at the high setpoint C2. When the value of the signal lies between these two setpoints C1 and C2, this value is used as setpoint C. Stated otherwise, the regulating loop 61 forms a setpoint C generating module receiving as input the signal I(t) or, more generally, any signal whose amplitude is proportional to the amplitude of the input signal Se(t), and delivering as output the setpoint C whose amplitude is determined as a function of the amplitude of the input signal Se(t). The setpoint C generated by the regulating loop 61 lies between the low setpoint C1 and the high setpoint C2.

Figure 7:
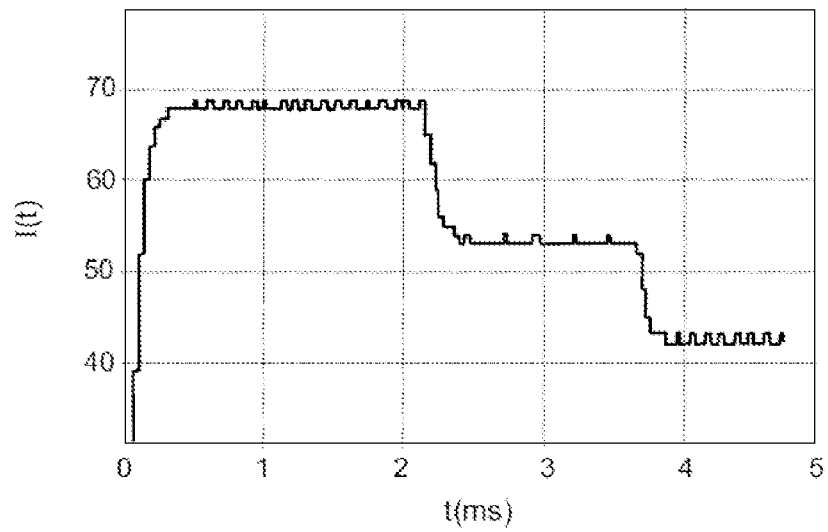
FIGS. 7 and 8 illustrate the operation of the automatic gain correction circuit of FIG. 6 by the amplitudes of the corresponding signals of FIGS. 4 and 5.
Figure 8:
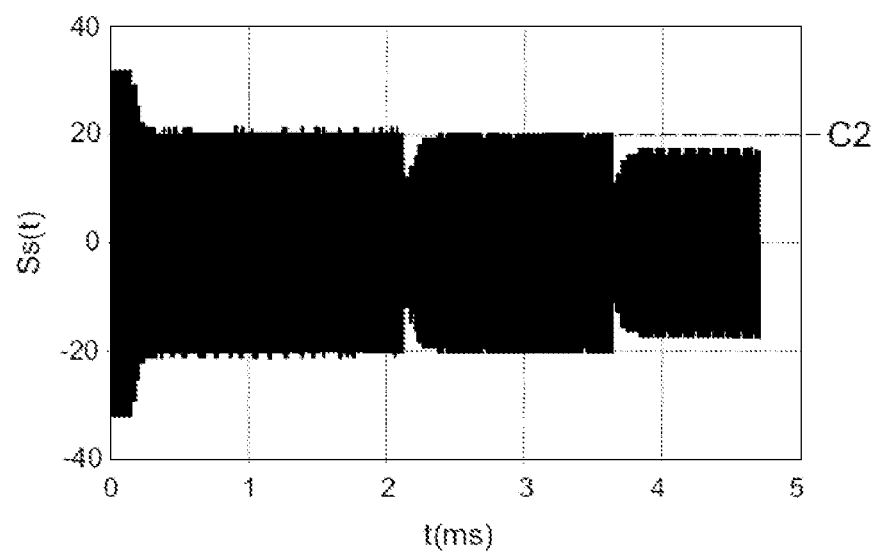

FIGS. 7 and 8 illustrate the operation of the CAG circuit 60 of FIG. 6. FIG. 7 represents, by a graph analogous to that of FIG. 4, the amplitude of the signal I(t) at the output of the integrator 312. The abscissa axis represents the time, in milliseconds. The ordinate axis represents the amplitude of the signal. The amplitude of the signal I(t) is represented for the same signal Se(t) as that of FIGS. 3 and 4, whose power is tier-wise constant. FIG. 8 represents, by a graph analogous to that of FIG. 5, the amplitude of the corresponding signal Ss(t). During the first two tiers, the amplitude of the signal at the input of the functional circuit 613 is above the high setpoint C2. Consequently, the amplitude of the signal Ss(t) is regulated around the high setpoint C2. On the other hand, during the third tier, the amplitude of the signal at the input of the functional circuit 613 is below the high setpoint C2. The amplitude of the signal Ss(t) is then regulated around a setpoint C, below the high setpoint C2. The amplitude of the signal Ss(t) is therefore dependent on the power of the signal to be amplified Se(t).

Figure 9:
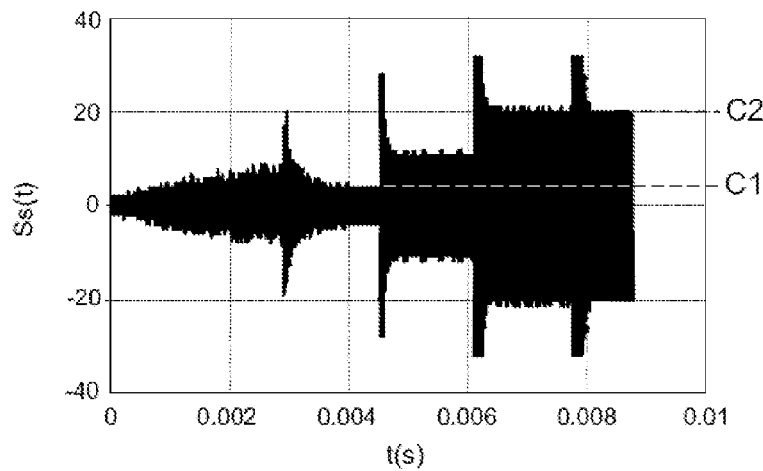
FIG. 9 represents the amplitude of the signal at the output of the automatic gain correction circuit of FIG. 6 for a signal at the input of this circuit having five power tiers.

The values of A and B can be determined in such a way that the low C1 and high C2 setpoints correspond to predetermined powers of the signal Se(t). By way of example, the values of A and B are determined so that the setpoints C1 and C2 correspond respectively to powers of the signal Se(t) of −80 dBm and −40 dBm. FIG. 9 represents, by a graph analogous to that of FIGS. 5 and 8, the amplitude of the signal Ss(t) for a signal Se(t) whose power is tier-wise constant. The power of the tiers is successively equal to −100 dBm, −80 dBm, −60 dBm, −40 dBm and −20 dBm. For the first two tiers, the amplitude of the signal Ss(t) is regulated around the low setpoint C1, corresponding substantially to a numerical amplitude of 6. For the last two tiers, the amplitude of the signal Ss(t) is regulated around the high setpoint C2, corresponding substantially to a numerical amplitude of 20. For the tier at −60 dBm, the amplitude of the signal Ss(t) is regulated to an intermediate setpoint between the setpoints C1 and C2.

More precisely, the values of the gain A of the amplifier 611 and of the constant B that is added to the signal can be determined by the following steps. In a first step, the setpoints C1 and C2 are determined as a function of the quantization scale of the CAN. The setpoint C1 can be determined in such a way that the amplitude of the signal Ss(t) is equal to the minimum value that can be quantized, for example −20 dBFS. The setpoint C2 can be determined in such a way that the amplitude of the signal Ss(t) is equal to the maximum value that can be quantized, that is to say 0 dBFS. In a second step, a variation of the gain G of the CAG circuit 60 as a function of the power of the signal Se(t) is determined for a given setpoint C. The gain G of the CAG circuit 60 is defined as being the ratio of the power of the signal Ss(t) to the power of the signal Se(t). By way of example, the given setpoint C is the high setpoint C2. In a third step, a minimum amplitude value I1 of the signal I(t), below which the signal Ss(t) must be regulated to the low setpoint C1, and a maximum amplitude value I2 of the signal I(t), above which the signal Ss(t) must be regulated to the high setpoint C2, are determined. These minimum I1 and maximum I2 values of amplitude of the signal I(t) depend directly on the gain G and on the power of the signal Se(t). The third step can therefore consist in determining a minimum gain and a maximum gain, or a minimum power of the signal Se(t) and a maximum power of the signal Se(t). For example, the minimum power of the signal Se(t), below which the signal Ss(t) is regulated to the setpoint C1 (−20 dBFS), is −80 dBm, and the maximum power of the signal Se(t), above which the signal Ss(t) is regulated to the setpoint C2 (0 dBFS), is −50 dBm. The setpoint C then substantially follows the law C=A.I(t)+B over the power span of Se(t) lying between −80 dBm and −50 dBm. In a fourth step, the values of A and of B are determined on the basis of the pair of points (I1, C1) and (I2, C2) by solving a system of two equations in two unknowns:

$$\begin{cases} C1 = A.I1 + B \\ C2 = A.I2 + B \end{cases}$$

Figure 10:
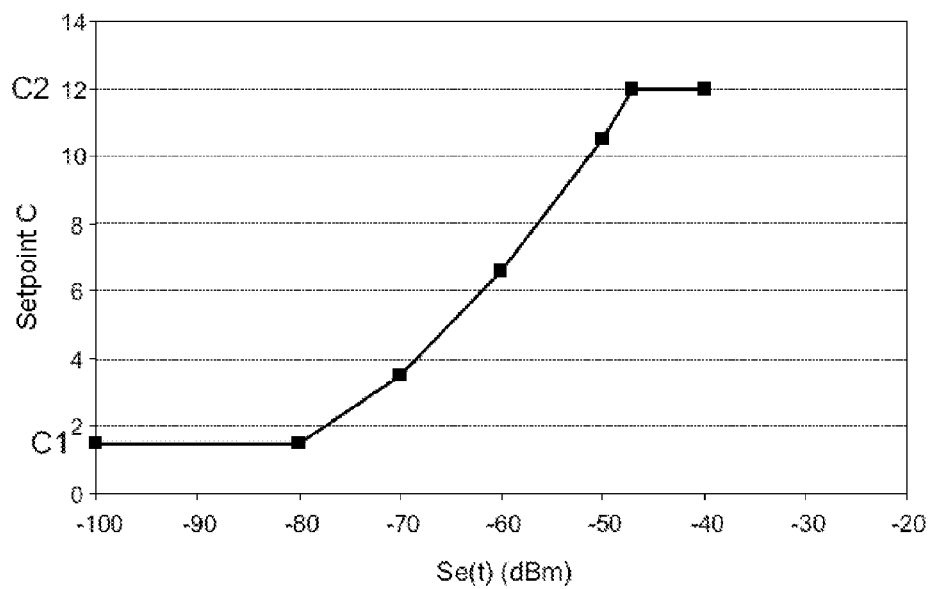
FIG. 10 represents, by a graph, an exemplary relation between the power of the signal at the input of the automatic gain correction circuit of FIG. 6 and a setpoint determined by said circuit.

FIG. 10 represents, by a graph, an exemplary relation between the power of the signal Se(t) to be amplified and the setpoint C determined by the regulating loop 61. In this example, the setpoints C1 and C2 are respectively equal to 1.5 and 12. The corresponding minimum and maximum powers of the signal Se(t) are respectively equal to −80 dBm and −47 dBm. In this figure, it should be noted that the law of variation of the setpoint C does not exactly follow a straight line between the minimum and maximum powers. This is due to the loopback of the setpoint, the signal I(t) being dependent on the setpoint C, and vice versa.

Figure 11:
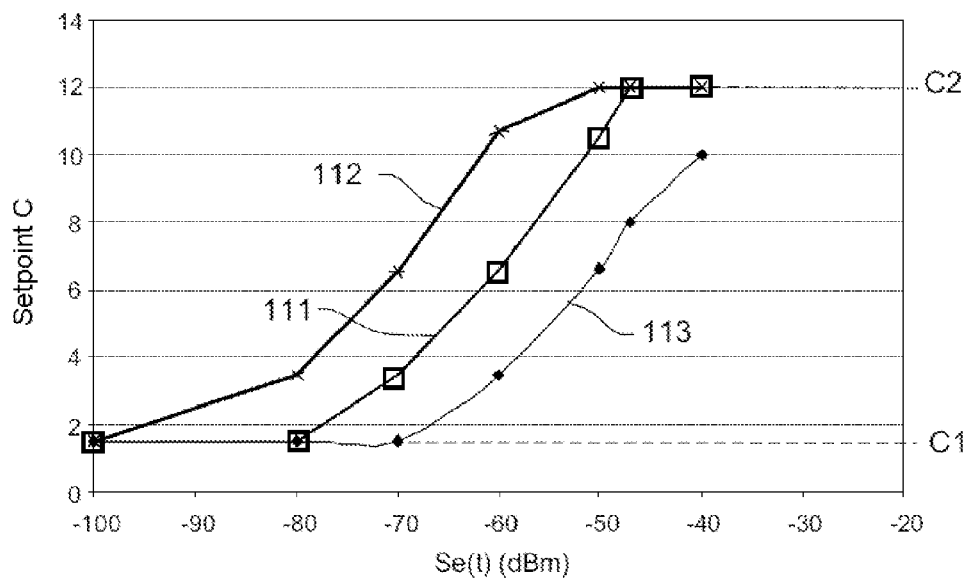
FIG. 11 represents, by a graph analogous to that of FIG. 10, examples of relation between the power of the signal at the input of the automatic gain correction circuit of FIG. 6 and the setpoint determined by said circuit in the presence of preamplifiers whose gains differ.

The CAG circuit 60 according to the invention makes it possible on the one hand to adapt the level of the regulating setpoint as a function of the amplitude of the signal to be amplified Se(t) and, on the other hand, to slave the amplitude of the amplified signal Ss(t) to the regulating setpoint. However, a problem can arise during the implementation of the CAG circuit 60 in a reception circuit whose overall gain is not known. This problem arises notably when the antenna and the preamplifier of the reception circuit originate from a third party manufacturer, or when they are exchanged. In such cases, the values of the gain A and of the constant B that are determined for a given gain curve are no longer suitable. FIG. 11 represents, by a graph, examples of relations between the power of the signal to be amplified Se(t) and the setpoint C for three preamplifiers of different gains. A first curve 111 represents this relation for a first preamplifier, with which the values of the gain A and of the constant B have been determined. The first curve 11 is therefore identical to the curve of FIG. 10. A second curve 112 and a third curve 113 represent the relations between the power of the signal Se(t) and the setpoint C, respectively, for a second preamplifier, whose gain is 10 dB greater than the gain of the first amplifier, and for a third preamplifier, whose gain is 10 dB lower than the gain of the first preamplifier. The second curve 112 shows that the setpoint increases too rapidly with the increase in the power of the signal Se(t). The gain of the radiofrequency chain being too high, the pulsed interferences are no longer coded with the whole of the dynamic range of the analog-digital converter and can then no longer be processed linearly by digital techniques for suppressing interference. Conversely, the third curve 113 shows that the setpoint increases too belatedly with the increase in the power of the signal Se(t). The gain of the radiofrequency chain being too low, the strong continuous interferences are not coded to the full scale of the analog-digital converter. The performance of the downstream digital processings is therefore degraded. To summarize, the knowledge of the overall gain of the reception circuit is desirable for the determination of the values of the gain A and of the constant B.

Figure 12:
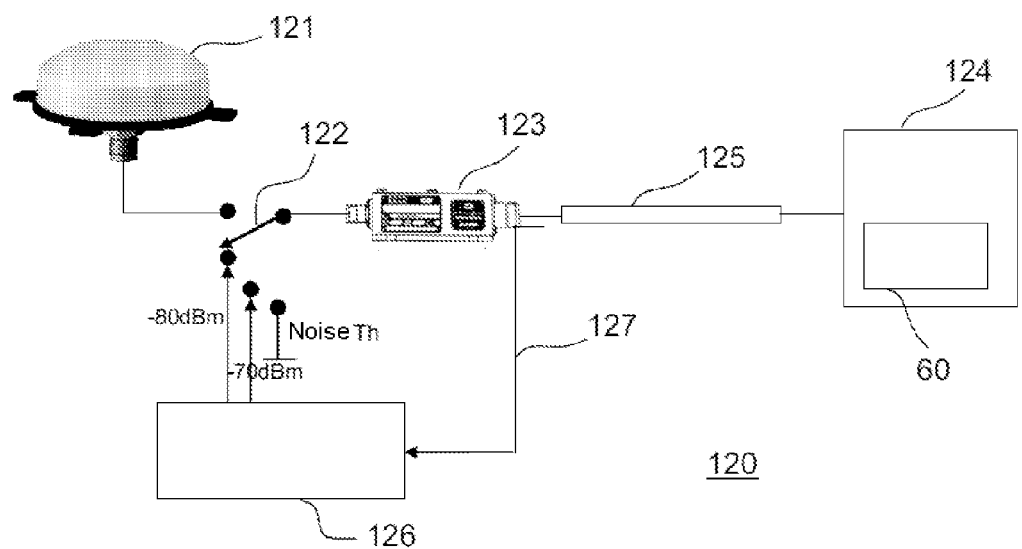
FIG. 12 represents an exemplary reception circuit integrating the automatic gain correction circuit of FIG. 6.

FIG. 12 represents an exemplary reception circuit in which a CAG circuit according to the invention is incorporated. The reception circuit 120 comprises an antenna 121, a switch 122, a preamplifier 123, a radiofrequency chain 124 for processing satellite signals, a link cable 125 connecting the output of the preamplifier 123 to the input of the radiofrequency chain 124, and a power signals generator 126. The generator 126 makes it possible to deliver signals whose power is calibrated. It must at the very least be able to deliver signals of two known reference powers. The powers −80 dBm and −70 dBm are considered by way of example. The selection of the reference powers to be applied is for example carried out by way of monitor signals passing down the link cable 125 and a link 127 to the generator 126. The switch 122 makes it possible to place the input of the preamplifier 123 in contact with the antenna 121, with an output of the generator 126 or with an electrical ground of the circuit 120. The preamplifier 123 can thus receive a signal whose power is equal either to −80 dBm, or to −70 dBm, or to the power of the thermal noise. The radiofrequency chain 124 comprises notably the CAG circuit 60 according to the invention. The overall gain of the reception circuit can be determined, for example on each power-up, by the following steps. In a first step, the setpoint of the CAG circuit 60 is fixed at a value close to the low setpoint C1, for example 1.5. In a second step, the power of the signal I(t) is determined for a first position of the switch 122, in which the preamplifier 123 receives a signal of power −80 dBm. This power is denoted $I_{80}$. In a third step, the power of the signal I(t) is determined for a second position of the switch 122, in which the preamplifier 123 receives a signal of power −70 dBm. This power is denoted $I_{70}$. By linear interpolation, the power of the signal I(t) can be determined for any power of the signal Se(t). The knowledge of the power of the signal I(t) makes it possible to calculate the gain between this signal I(t) and the signal at the output of the antenna 121. This gain thus makes it possible to calculate the minimum I1 and maximum I2 values of amplitude of the signal I(t) for predetermined powers of the signal Se(t), corresponding to the setpoints C1 and C2. Furthermore, the gain constitutes a jamming indicator. The values of A and of B can then be determined on the basis of the pair of points (I1, C1) and (I2, C2), as indicated previously.

Moreover, it is possible to determine the signal I(t) amplitude $I_{Th}$ obtained when the preamplifier 123 is connected to the electrical ground of the circuit 120, that is to say for a signal whose power is that of the thermal noise. The amplitudes $I_{Th}$, $I_{80}$ and $I_{70}$ make it possible to determine an interference level indicator J/N defined by the following relation:

$$J/N = 10 \frac{I(t) - I_{Th}}{I_{70} - I_{80}}.$$

This indicator J/N can notably be used by the radiofrequency chain 124 in the interference suppression algorithms.

The invention claimed is:

1. An automatic gain correction circuit configured to receive an input radiofrequency signal and to deliver an output radiofrequency signal of which a mean amplitude is slaved to a setpoint, comprising:
   means for generating the setpoint as a function of the mean amplitude of the input signal, said setpoint configured to evolve between a minimum setpoint value and a maximum setpoint value, the minimum setpoint value corresponding to a first mean amplitude of the input signal and the maximum setpoint value corresponding to a second mean amplitude of the input signal, the first mean amplitude being lower than the second mean amplitude;
   an open loop;
   an adder receiving on a first input the input signal and on a second input a signal as output from the open loop, the adder delivering on an output the output signal;
   a return loop receiving said output signal;
   a subtractor receiving on a first input a signal as output from the return loop and on a second input the setpoint, the subtractor having an output delivering a signal equal to the difference between the two signals received as input, said signal being injected on an input of the open loop; and
   a regulating loop receiving a signal from the open loop and delivering the setpoint.

2. The automatic gain correction circuit as claimed in claim 1, in which the setpoint varies linearly as a function of the mean amplitude of the input signal between the first and the second mean amplitude of the input signal.

3. The automatic gain correction circuit as claimed in claim 1, in which the open loop further comprises an amplifier of gain G1 and an integrator mounted in series, the regulating loop receiving the signal as output from the integrator.

4. The automatic gain correction circuit as claimed in claim 3, in which the open loop further comprises a second amplifier of gain G2 mounted at the output of the integrator.

5. The automatic gain correction circuit as claimed in claim 1, in which the return loop further comprises an amplifier of gain G3 and a rectifier which is configured to extract the absolute value of the signal circulating in the return loop.

6. The automatic gain correction circuit as claimed in claim 1, in which the regulating loop further comprises an amplifier of gain A, an adder and a functional circuit mounted in series, the adder receiving on a first input the signal as output from the amplifier of gain A and on a second input a constant signal B, the functional circuit delivering:
   a setpoint equal to the signal at the output of the adder when the value of said signal lies between the minimum setpoint value and the maximum setpoint value,
   a setpoint equal to the minimum setpoint value when the value of said signal is lower than said setpoint value, and
   a setpoint equal to the maximum setpoint value when the value of said signal is greater than said setpoint value.

* * * * *